(12) United States Patent
Gurvich et al.

(10) Patent No.: US 7,339,426 B2
(45) Date of Patent: Mar. 4, 2008

(54) HIGH EFFICIENCY LINEAR AMPLIFIER EMPLOYING DYNAMICALLY CONTROLLED BACK OFF

(75) Inventors: Mark Gurvich, Costa Mesa, CA (US); Ahmad Khanifar, Laguna Hills, CA (US); Nikolai Maslennikov, Huntington Beach, CA (US); Alexander Rabinovich, Cypress, CA (US)

(73) Assignee: Powerwave Technologies, Inc., Santa Ana, CA (US)

( * ) Notice: Subject to any disclaimer, the term of this patent is extended or adjusted under 35 U.S.C. 154(b) by 27 days.

(21) Appl. No.: 11/081,384

(22) Filed: Mar. 16, 2005

(65) Prior Publication Data

US 2005/0242875 A1    Nov. 3, 2005

Related U.S. Application Data

(60) Provisional application No. 60/560,889, filed on Apr. 9, 2004, provisional application No. 60/554,648, filed on Mar. 19, 2004.

(51) Int. Cl.
*H03G 3/30*    (2006.01)
(52) U.S. Cl. ........................ 330/136; 330/297
(58) Field of Classification Search ................ 330/136
See application file for complete search history.

(56) References Cited

U.S. PATENT DOCUMENTS

| | | | |
|---|---|---|---|
| 3,900,823 A | 8/1975 | Sokal et al. | 330/149 |
| 4,320,350 A | 3/1982 | Drapac | 330/202 |
| 4,346,349 A | 8/1982 | Yokoyama | 330/10 |
| 5,287,069 A | 2/1994 | Okubo et al. | 330/10 |
| 5,757,229 A | 5/1998 | Mitzlaff | 330/124 |
| 5,777,519 A | 7/1998 | Simopoulos | 330/297 |
| 5,786,727 A | 7/1998 | Sigmon | 330/124 |
| 5,789,984 A | 8/1998 | Davis et al. | 330/279 |
| 5,793,253 A | 8/1998 | Kumar et al. | 330/124 |
| 5,929,702 A | 7/1999 | Myers et al. | 330/136 |
| 6,043,707 A | 3/2000 | Budnik | 330/10 |
| 6,049,707 A * | 4/2000 | Buer et al. | 455/314 |
| 6,081,161 A | 6/2000 | Dacus et al. | 330/297 |
| 6,157,253 A | 12/2000 | Sigmon et al. | 330/10 |
| 6,239,656 B1 | 5/2001 | Nagata et al. | 330/124 |
| 6,268,768 B1 | 7/2001 | Blodgett | 330/107 |
| 6,297,696 B1 | 10/2001 | Abdollahiam et al. | 330/124 |
| 6,300,826 B1 | 10/2001 | Mathe et al. | 330/10 |
| 6,362,685 B1 | 3/2002 | Vagher | 330/124 |
| 6,437,641 B1 | 8/2002 | Bar-David | 330/10 |
| 6,490,175 B2 * | 12/2002 | Raets et al. | 363/17 |
| 6,515,541 B2 | 2/2003 | Cheng et al. | 330/51 |

(Continued)

OTHER PUBLICATIONS

"Considerations on Applying OFDM in a Highly Efficient Power Amplifier" by Liu et al.

*Primary Examiner*—Robert Pascal
*Assistant Examiner*—Alan Wong
(74) *Attorney, Agent, or Firm*—Myers Dawes Andras & Sherman LLP

(57) ABSTRACT

A high efficiency radio frequency (RF) power amplifier having dynamically controlled back off is disclosed. The RF input voltage is sampled by an adaptive analog signal processing circuit. The adaptive analog signal processing circuit controls the supply voltage to RF amplifier devices, such as LDMOS devices, which varies the efficiency or back off of the power amplifier. The variable supply voltage in turn varies peak power of the amplifier.

14 Claims, 6 Drawing Sheets

U.S. PATENT DOCUMENTS

| | | |
|---|---|---|
| 6,566,944 B1 | 5/2003 | Pehlke et al. ................. 330/10 |
| 6,583,664 B2 | 6/2003 | Mathe et al. ................. 330/10 |
| 6,617,920 B2 | 9/2003 | Staudinger et al. ......... 330/149 |
| 6,617,929 B2 | 9/2003 | Kim et al. ................. 330/295 |
| 6,661,284 B1 | 12/2003 | Luz et al. ................... 330/124 |
| 6,703,897 B2 * | 3/2004 | O'Flaherty et al. ......... 330/149 |
| 7,091,777 B2 * | 8/2006 | Lynch ....................... 330/136 |
| 2002/0171477 A1 | 11/2002 | Nakayama et al. ............ 330/53 |
| 2002/0186079 A1 | 12/2002 | Kobayashi ................... 330/124 |
| 2003/0214355 A1 | 11/2003 | Luz et al. ................... 330/124 |
| 2004/0174212 A1 | 9/2004 | Kim et al. ................... 330/124 |
| 2004/0222847 A1 | 11/2004 | Khanifar ..................... 330/136 |
| 2004/0222853 A1 * | 11/2004 | Lee et al. ................... 330/285 |

* cited by examiner

HIGH EFFICIENCY LINEAR AMPLIFIER EMPLOYING DYNAMICALLY CONTROLLED BACK OFF

RELATED APPLICATION INFORMATION

The present application claims priority under 35 USC Section 119(e) to provisional application Ser. No. 60/554,648 filed Mar. 19, 2004 and provisional application Ser. No. 60/560,889 filed Apr. 9, 2004, the disclosures of which are incorporated herein by reference in their entirety.

FIELD OF THE INVENTION

The invention relates in general to power amplifiers and, more particularly, to high efficiency power amplifier circuits. More particularly, the invention relates to amplifiers operating at microwave frequencies with high peak to average ratio input RF signals.

BACKGROUND OF THE INVENTION

Modern cellular communication systems employ RF power amplifiers in their base stations, in order to provide communication means to subscribers. To achieve maximum utilization of available spectrum power amplifiers are required to amplify multiple Radio Frequency (RF) carriers. In addition to multiple RF carriers, each RF carrier employs a digital coding scheme such as Code Division Multiple Access (CDMA), which allows for multiple users to utilize the same spectrum. In addition to CDMA, there are systems that employ a modulation format known as Orthogonal Frequency Division Multiplexing (OFDM), in which the signal from a single user is first subdivided. Each subdivision is then modulated by a multiplicity of staggered sub carriers. The modulated sub carriers are then added up, thus causing large peak excursions in the RF signal carriers.

RF carriers modulated with large peak-to-average ratio signals require conventional RF amplifiers that are costly and relatively inefficient. One reason for such inefficiency is that a conventional RF power amplifier becomes efficient only during the occurrence of high output signal levels, i.e., when the instantaneous power output is large. However, during most of the time, the average power output is only a small fraction of the peak power, resulting in low overall efficiency, typically below 10%. Therefore, it is highly desirable to employ RF power amplifier circuits that incorporate high efficiency techniques, which can provide efficient operation over a wide dynamic back-off range.

One possible solution for improvement of efficiency in high power amplifiers involves the use of envelope elimination and restoration (EER). EER is a technique that employs high efficiency power amplifiers, which can be combined to produce a high efficiency linear amplifier system. In this method, a modulated input signal is split into two paths: an amplitude path through which the envelope of the modulated input signal is processed, and a phase path through which the phase modulated carrier of the modulated input signal is processed. In order for the EER technique to be effective the envelope of the modulated input signal is amplified with a highly efficient, narrow band amplifier. Conjunctionally, a high efficiency amplifier is used to amplify the high frequency phase modulated carrier with the amplified envelope signal. The EER technique is unique in that the amplifier, which generates the amplified envelope signal, also acts as the DC power supply to the high frequency amplifier. The efficiency of such EER amplifier systems can be calculated by multiplying the efficiencies of the two amplifiers. For example, if the efficiency of the first amplifier is 50 percent and that of the second amplifier efficiency is 40 percent, the total efficiency of the EER amplifier system will be 0.50*0.40=0.2 or 20 percent.

While these prior EER approaches may offer viable efficiency enhancement solutions, they add additional complexity due to support circuits and diminished linearity over operating conditions. Therefore, the desired combination of linearity and efficient operation, especially where large peak signals are present, has not yet been achieved.

Past amplifier measurements have confirmed that adequate inter-modulation distortion (IMD) performance requires that the amplifier's saturated power (Psat) must be greater than or equal to the amplified input signal's peak power ($P_{peak}$). If a power amplifier has been tuned for a maximum peak power ($P_{sat}$), this parameter basically depends on DC supply voltage (Vds). Due to their statistical nature, digital signal's peak power levels occur infrequently and their duration is very short near Psat levels. Therefore, it can be stipulated that the output stage of the power amplifier requires high drain supply voltage levels Vds only during these high power level excursions and for a short duration. Statistical signal analyses of digital signals indicate that the output stage of the power amplifier doesn't require high voltage during the majority of its operating time. It is advantageous to decrease Vds while tracking the input signal's envelope, which in turn will decrease average power consumption. A decrease in DC power consumption directly improves overall amplifier efficiency. On the other hand, any variation in Vds results in a gain and phase variation in a transistor stage. Gain and phase variation vs. Vds must be controlled if a dynamic Vds system is to be implemented. Constant AM-AM and AM-PM are the key requirements for power amplifier linearity.

Therefore, a need presently exists for a high efficiency power amplifier design which provides the desired linearity despite high peak to average power ratio input RF signals.

SUMMARY

Figure 1:
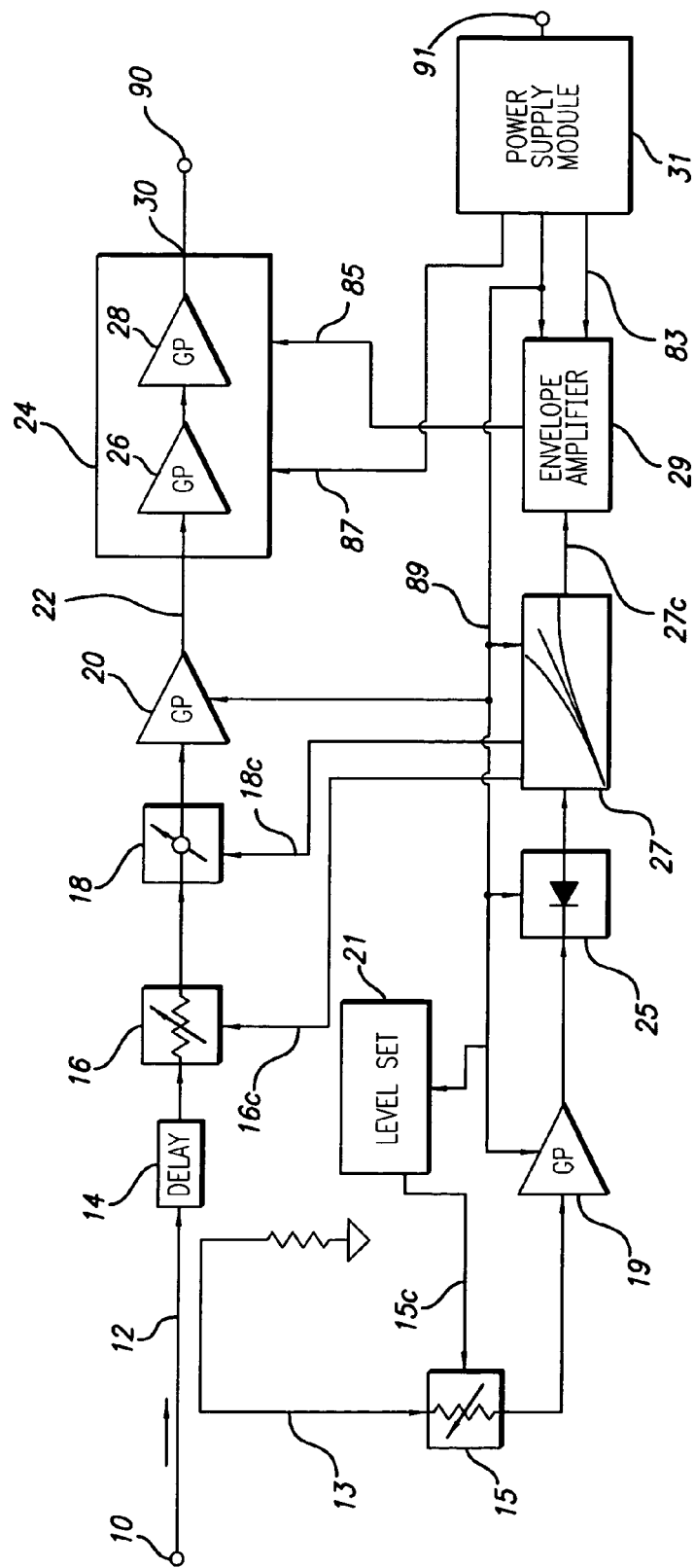
FIG. 1 is a schematic drawing of an RF power amplifier according to a preferred embodiment of the present invention.

In a first aspect the present invention provides a power amplifier system comprising an input for receiving an RF input signal including a modulated RF carrier having a dynamically varying envelope. A first signal path is coupled to the input and includes an RF amplifier receiving and amplifying the RF input signal including the carrier and envelope, the RF amplifier having a power supply input, and the power amplifier system comprises a DC power supply. A second signal path is coupled to the input and comprises an envelope detector and an envelope amplifier responsive to the output of the envelope detector. The envelope amplifier is coupled to the DC power supply and the RF amplifier and provides a power supply signal to the RF amplifier which varies with the envelope of the input signal to control the back off of the RF amplifier.

In a preferred embodiment of the power amplifier system the envelope amplifier comprises a switching circuit which switches a power supply signal into the RF amplifier power supply input with a frequency related to the envelope of the input signal. The envelope amplifier further comprises a preamplifier and a push pull circuit, wherein the preamplifier is coupled to the envelope detector output, the push pull circuit is coupled to the preamplifier output, and the push pull circuit and the switching circuit are coupled to the DC power supply. The push pull circuit comprises first and second MOSFET transistors of opposite conductivity type. The envelope amplifier further comprises a threshold detector. The first signal path preferably further comprises a voltage variable attenuator for adjusting the magnitude of the input signal and the second signal path preferably further comprises a predistorter which is coupled to the output of the envelope detector and provides a control signal to the voltage variable attenuator based on the envelope signal output from the envelope detector. The first signal path preferably further comprises a phase adjuster for adjusting the phase of the input signal and the second signal path preferably further comprises a predistorter which is coupled to the output of the envelope detector and provides a control signal to the phase adjuster based on the envelope signal output from the envelope detector.

According to another aspect the present invention provides a power amplifier system comprising an RF input for receiving an RF input signal and an RF output for providing an amplified RF output signal in response to the RF input signal. A coupler is provided which has its input port coupled to the RF input and has first and second outputs. A first signal delay element is coupled to the first output of the coupler. A first voltage variable attenuator has an input coupled to the output of the first signal delay element and a control port. A phase shifter has an input port coupled to the output port of the first voltage variable attenuator. A first gain stage has an input port coupled to the output of the phase shifter. The power amplifier system further comprises a power gain module comprising at least one RF power amplifier, which has an input port, an output port, and a DC supply port. The input port of the power gain module is coupled to the output of the first gain stage and the output port is coupled to the RF output. An envelope detector is functionally coupled to the second output of the coupler, and is operable to determine an envelope of the input RF signal. A predistorter has an input port functionally coupled to the output of the envelope detector, the predistorter having first, second and third output control ports. The control port of the voltage variable attenuator is coupled to the first output port of the predistorter and the control port of the phase shifter is coupled to the second output port of the predistorter. A switch mode envelope amplifier has an input port coupled to the third output port of the predistorter, a first output DC port coupled to the DC supply port of the power gain module, and first and second input DC ports. The power amplifier system further comprises a DC power supply which provides a plurality of DC voltages and has at least one input DC port, wherein the DC power supply is coupled to the first and second input DC ports of the switch mode envelope amplifier.

In a preferred embodiment of the power amplifier system the coupler is a directional coupler. In one detailed implementation the switch mode envelope amplifier comprises a preliminary amplifier, a first DC supply terminal having positive and negative input terminals, a second DC supply terminal having positive and negative input terminals, a first MOSFET transistor having gate, source and drain terminals, a current sensing resistor disposed between the first DC positive terminal and the drain of the first MOSFET transistor and having a first and second terminal, a second MOSFET transistor having gate, source and drain terminals, wherein the source terminal is functionally coupled to ground, a comparator which responds to an amplitude of current through the current sensing resistor, the comparator having a first input coupled to the resistor first terminal and a second input coupled to the resistor second terminal, and a switching stage having an input coupled to the comparator and an output functionally coupled to the second DC supply positive terminal. The switch mode amplifier may also comprise a feedback module having an input port and an output port coupled to the preamplifier, wherein a common junction node is formed between the first MOSFET source terminal, the second MOSFET drain terminal, the switching stage output port, the second DC supply positive terminal, and the feedback module input port. The preliminary amplifier preferably has a positive input port for receiving the envelope signal, a negative input port for receiving the envelope signal, a first gate drive port, functionally coupled to the gate terminal of the first MOSFET transistor, a second drive port, functionally coupled to the gate terminal of the second MOSFET transistor, and a feedback port coupled to the output port of the feedback module. The power gain module preferably comprises a drive stage and a power gain stage, and the drive stage and power gain stage have separate DC supply terminals. The second DC supply terminal of the switch mode envelope amplifier is functionally coupled to the power gain stage DC supply terminal. The switching stage is preferably operable at a frequency of between 1 and 50 MHz. The switching stage current contribution is determined by a current threshold limit which is the current through the current sensing resistor. The power amplifier system may further comprise a level setting network having a control output and a second voltage variable attenuator having an input port functionally coupled to the coupler and a control port coupled to the control output of the level setting network. A second gain stage may be provided having an input port coupled to the output of the second voltage variable attenuator and an output port coupled to the envelope detector.

According to another aspect the present invention provides a method for amplifying a high frequency modulated signal having a carrier and a dynamically varying envelope. The method comprises receiving a high frequency modulated input signal having a carrier and a dynamically varying envelope and amplifying the high frequency modulated input signal, including both the carrier and dynamically varying envelope, with a power amplifier module. The method further comprises providing a DC supply voltage to the power amplifier module, detecting the envelope of the high frequency modulated input signal and controlling the DC supply voltage of the power amplifier module in response to the detected envelope to dynamically adjust the power amplifier module back off.

In a preferred embodiment of the method for amplifying a high frequency modulated signal, controlling the DC supply voltage of the power amplifier module in response to the detected envelope comprises switching a power supply signal with a switching frequency varying with the detected envelope. The carrier signal may be an RF signal in the GHz range, with an envelope modulated in the high KHz range or MHz range, and the switching frequency preferably varies in the high KHz range or MHz range. More specifically, the carrier signal may be an RF signal in the 1-10 GHz range, with an envelope modulated in the range of up to 15 MHz, and the switching frequency preferably varies in the range of 1-50 MHz.

Further features and advantages of the present invention are set out in the following detailed description.

DETAILED DESCRIPTION OF THE PREFERRED EMBODIMENT

FIG. 1 illustrates an exemplary RF power amplifier according to one embodiment of the present invention. An input signal is applied to input port 10. The input signal is a high frequency modulated signal with an RF carrier, for example, employing CDMA or WCDMA modulation. Such signals typically have a carrier in the GHz range and more specifically typically in the 1-10 GHz range, and a modulated envelope typically in the high KHz range or MHz range and more specifically typically in the range of about 900 KHz to 15 MHz. A majority of the input signal, including both the carrier and envelope, is provided along a main signal path (upper path in FIG. 1) by directional coupler 12 to delay 14 and first voltage variable attenuator 16. Directional coupler 12 also transfers a portion of the input RF signal, including both carrier and envelope, along a second signal path 13 from the input port to the input of a second voltage variable attenuator 15. Those skilled in the art will appreciate that first voltage variable attenuator 16 and second voltage variable attenuator 15 may be conventional circuits and various embodiments can be used for these circuits. The output of second voltage variable attenuator 15 is coupled to an input of a wide dynamic gain stage 19, which may be a conventional high dynamic range amplifier circuit. The output of the gain stage 19 is a level stabilized radio frequency signal, as processed by second voltage variable attenuator 15 and high dynamic range amplifier stage 19, which is input to a linear envelope detector 25. More specifically, input signal levels are level stabilized with second voltage variable attenuator 15 and high dynamic range amplifier stage 19 by control line 15c which addresses gain variations of the high dynamic range amplifier stage 19 as well as the input RF signal types.

Linear envelope detector 25 receives the level stabilized radio frequency signal output from the high dynamic range amplifier stage 19 and determines the envelope amplitude of the signal. Design of suitable envelope detector circuits are known in the art and can include a diode and other passive linear and/or nonlinear components which function to filter the carrier frequency from the radio frequency signal sample and present its envelope amplitude at an output. The envelope amplitude of the radio frequency signal from linear envelope detector 25 is conveyed to predistorter 27. Envelope based predistorter circuit 27 generates first, second and third control voltage signals provided along lines 16c, 18c and 27c, respectively, for use with attenuator 16, phase shifter 18 and envelope amplifier 29. More specifically, in the second signal path, (lower path of FIG. 1), envelope amplifier 29 is coupled to receive the third output 27c of the envelope predistorter 27. The third output 27c of the envelope predistorter 27 contains the envelope fundamental frequency as well as higher order harmonics of the envelope frequency. The third output 27c of the envelope predistorter 27 is used by the envelope amplifier 29 to control the drain supply voltage to main path amplifier module 24 provided along line 85 from power supply module 31, which is used to provide constant power amplifier gain by adjusting the amplifier back off, i.e., the ratio of the power supply to a nominal input signal power.

Still referring to FIG. 1, in the main signal path (top path of FIG. 1), directional coupler 12 transfers the bulk of the input RF signal 10 to the input port of the delay line 14. The delayed RF signals are coupled to the input of the first voltage variable attenuator 16. The first output of the envelope based predistorter circuit 27 provided along line 16c adjusts the control voltage of the variable attenuator 16 and is used to flatten the AM-AM response of the amplifier system as described in more detail below. The attenuated input signal is then coupled to a phase shifter network 18. Phase shifter 18 is responsive to the second output of the envelope based predistorter circuit 27 provided along line 18c and is used to flatten the AM-PM response of the amplifier system as described in more detail below. The output of phase shifter 18 is provided to driver stage 20, which may provide a pre-amplification to the RF signal, and the output of driver 20 is provided to high power RF amplifier module 24. High power RF amplifier module 24 is employed to amplify the RF input signal levels, including the RF carrier and modulated envelope. Such power RF amplifier can employ any of a number of topologies, but presently a multi-stage LDMOS Class AB biased module provides an optimum efficiency-linearity implementation. Those skilled in the art will appreciate that other semiconductor technologies can be used as well, such as, but not limited to GaAs, Bipolar, etc., as well as vacuum tubes such as TWT and the like. Preferably, output power stages 28 are biased in Class-AB bias, while low power drive stages 26 can biased in Class-AB or A. Because of differences in operating regimes it is desirable that driver stage 26 is fed from an independent DC supply 87 from power stage(s) 28 which have a separate DC supply 85 provided via envelope amplifier 29.

Figure 2:
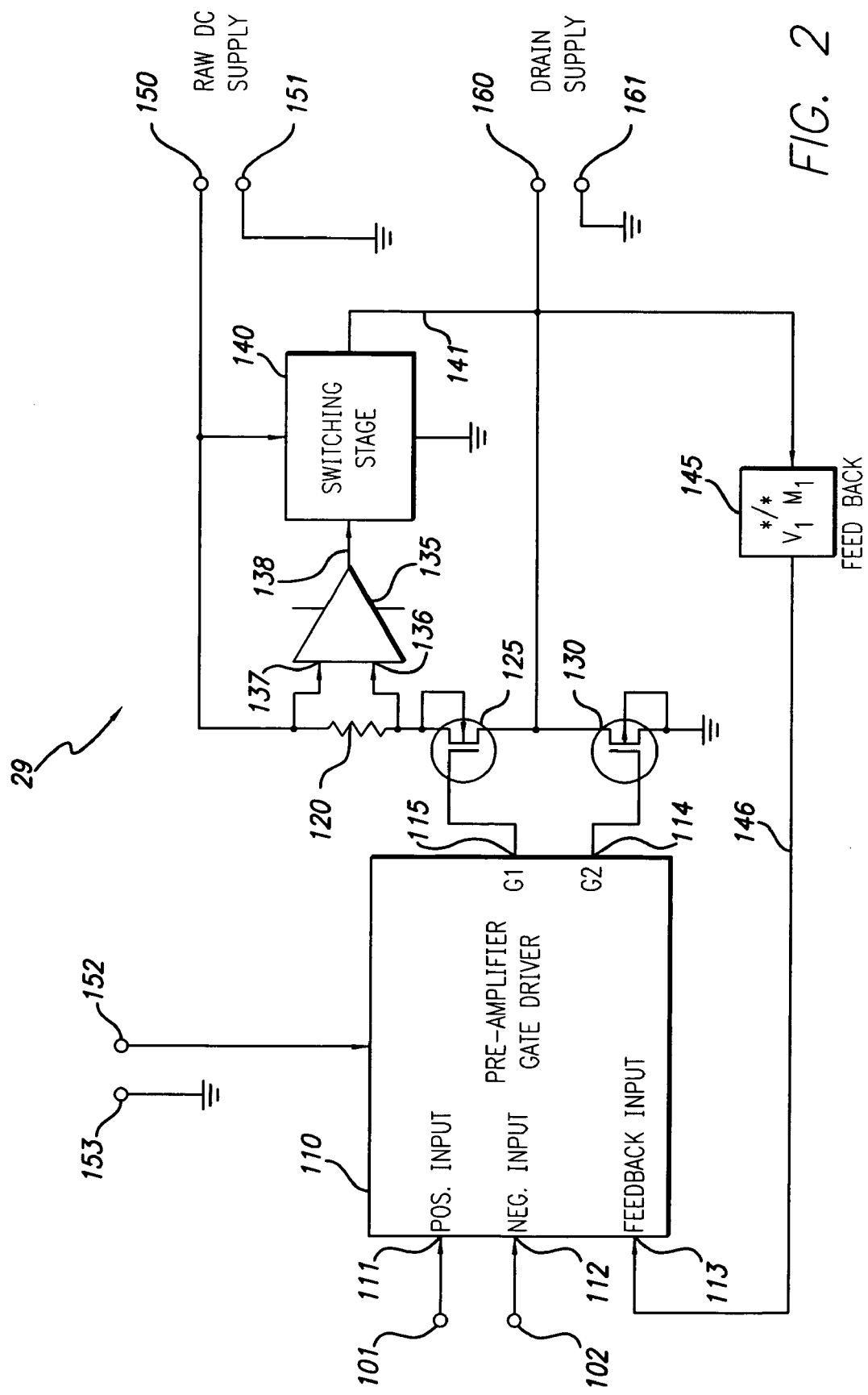
FIG. 2 is a schematic drawing of a preferred embodiment of the envelope amplifier of FIG. 1.

Referring to FIG. 2, a preferred embodiment of envelope amplifier 29 is disclosed. Those skilled in the art will understand that certain circuit details were omitted to exemplify principles of operations in the present invention and may be implemented utilizing a number of suitable circuits.

As shown in the illustrated preferred embodiment of FIG. 2, envelope amplifier 29 comprises the following circuits: pre-amplifier—gate driver circuit 110; a high speed DC supply circuit employing a push-pull pair comprising first and second transistors, 125, 130 which may be P-channel and N-channel MOSFET's, respectively; a low frequency (relative to carrier frequency), high current switching stage 140; and a feedback circuit 145 (used for impedance stabilization of drain supply 85). In addition to the above-mentioned circuits envelope amplifier 29 comprises the following input and output terminals: an envelope signal input having a positive terminal 101 and negative terminal 102 (corresponding to envelope signal 27c of FIG. 1), a raw DC supply having a positive terminal 150 and negative terminal 151 (corresponding to supply 83 in FIG. 1), low voltage supply having a positive terminal 152 and negative terminal 153 (corresponding to supply 89 in FIG. 1), and drain supply impedance having a positive terminal 160 and negative terminal 161 (corresponding to supply 85 in FIG. 1).

As shown in FIGS. 1 and 2 the second output 27c of the envelope predistorter 27 is provided as an input to the pre-amplifier—gate driver circuit 110 positive and negative inputs 111, 112 via terminals 101, 102. The pre-amplifier—gate driver circuit 110 amplifies and level shifts the predistorted envelope signal 27c. In addition pre-amplifier—gate driver circuit 110 receives feedback signal at feedback input 113 which is used for source impedance stabilization. The two gate driving terminals 115 (G1) and 114 (G2) are connected to the gates of first and second MOSFET transistors 125, 130, respectively. The first and second MOSFET transistors 125, 130 are preferably biased in Class AB or B, although Class C bias operation may be suitable for some applications. Class B (or AB) bias is preferably chosen to reduce the drive levels required to turn on each MOSFET. Also, a combination of bias class may be used; for example transistor 125 may be a Class AB biased P-channel MOSFET and transistor 130 may be a Class B biased N-channel MOSFET. The average operating current through this pair of transistors can be, for example, 120 to 180 mA depending on MOSFET type. When driven by signals from G1 115 and G2 114 with sufficient gate bias, first 125 and second 130 MOSFET transistors turn on and drain current flows through shunt resistor 120. MOSFET transistors, which are capable of controlling high drain currents typically have high gate capacitance, which precludes high-speed switching with low drive levels. Thus, a high current drive would normally be required to get around this limitation. However, such an approach would suffer from degraded overall efficiency due to increased size and power of the gate driving circuits. This deficiency is avoided by limiting the amount of drive required to turn on the MOSFET transistors by choice of bias class and by limiting the average current that the two devices must supply to the drain supply. Notwithstanding such average current limiting, the two MOSFET transistors deliver full peak current required by the RF power devices during RF signal peak excursion. RF signal analysis reveals that the duration of high power RF peaks is very short and their occurrence is dependent on the CCDF of the RF signal.

Still referring to FIG. 2, a threshold comparator circuit 135 monitors current drawn through shunt (or current sensing) resistor 120. Thus, threshold comparator circuit 135 controls when the switching stage will contribute current to the drain supply 160. For example, when current through shunt resistor 120 exceeds a predetermined current limit threshold, comparator 135 will enable the switching stage 140 to supply current to drain supply 170. Various implementations of switching stage 140 are possible. For example, the output of the comparator circuit may be buffered by a buffer circuit and used to drive a gate of a fast p-channel MOSFET in switching stage 140. Efficiency of this type of circuit 140 is directly dependent on the switching frequency, slew rate and Rdson of the MOSFET employed. Other circuit designs may also be employed. Once switching stage 140 starts to deliver current to the drain supply 160 the current through the shunt resistor 120 will fall. This switching action is presented in FIG. 3. Due to this circuit pulse operation, the actual switching frequency is directly dependent on the input signal envelope. Switching stage 140 has a slow response rate which allows the output current on line 141 to follow the low frequency component of the predistorted envelope signal 27c. The voltage ripple caused by the switchover process is minimized via negative feedback circuit 145, which substantially reduces such voltage ripple to acceptable levels.

As shown in FIG. 1, the envelope amplifier 29 is used to control voltage levels to the output stage of the power amplifier module 24. Based on these requirements envelope amplifier 29 has to deliver sufficient power for the output stage of the power amplifier. Accordingly, power amplifier efficiency can reach, e.g., 55% at maximum output level. With Vmax voltage available at the peak power level current will reach:

$$Idc = \frac{Pout}{Vmax} * \frac{1}{Eff}$$

Instantaneous peak (maximum) current should be delivered to the output stage transistors at the moment of the signal peak. Equivalent DC load resistance for the envelope amplifier in this case is:

$$Rl = \frac{Vmax}{Idc}$$

At the other extreme when there is no input signal, the drain voltage can be decreased substantially down, e.g., 75 percent, depending on the output devices.

Figure 3:
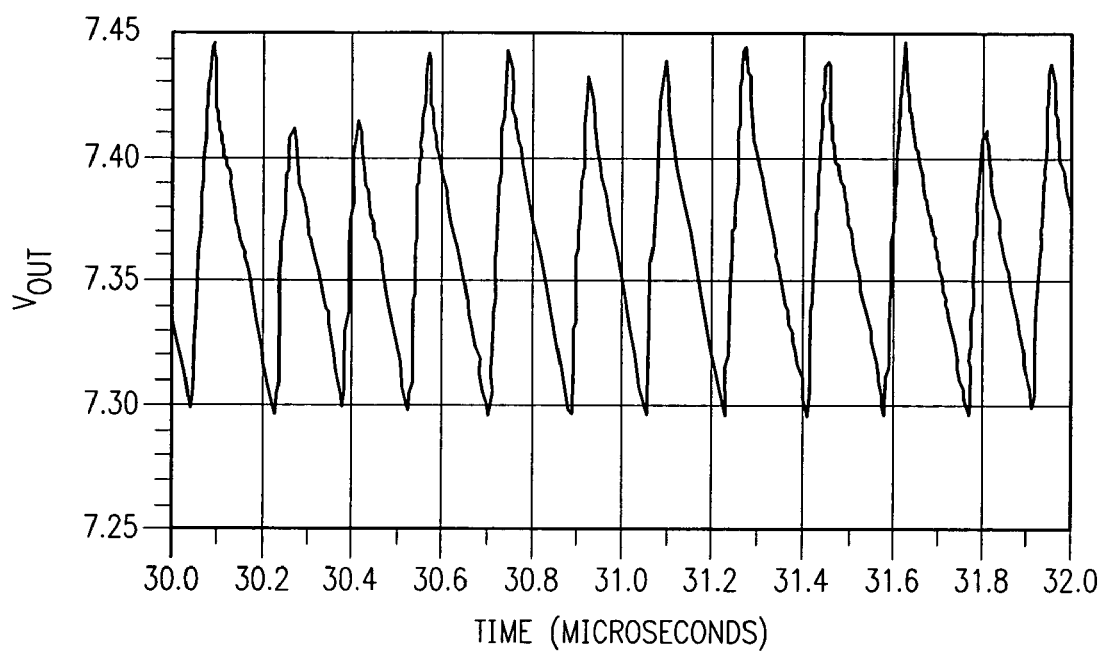
FIG. 3 is a graphical representation of the switching action of the switching stage employed in the envelope amplifier of FIG. 2.
Figure 4A:
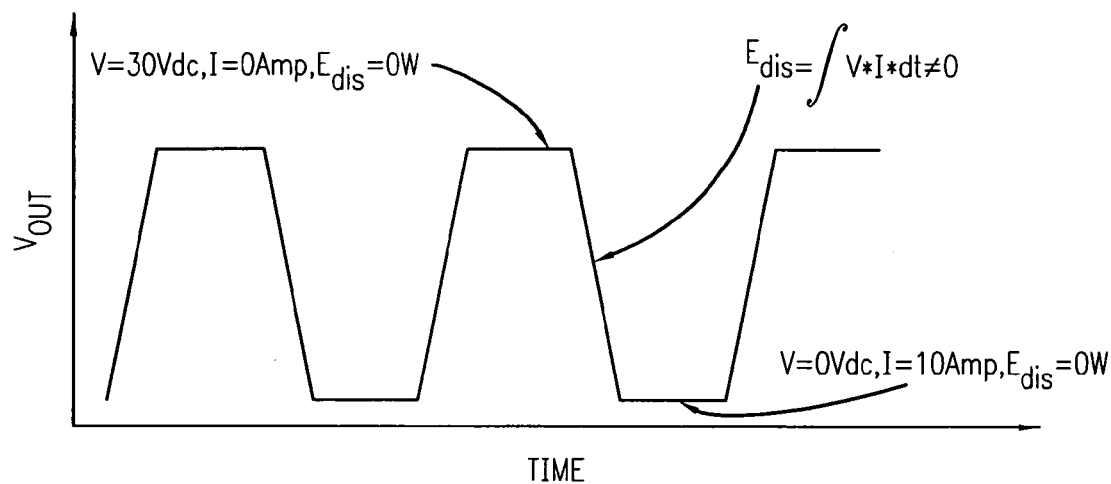
FIG. 4A and FIG. 4B are graphical representations on the effect of switching frequency on the switching stage output.
Figure 4B:
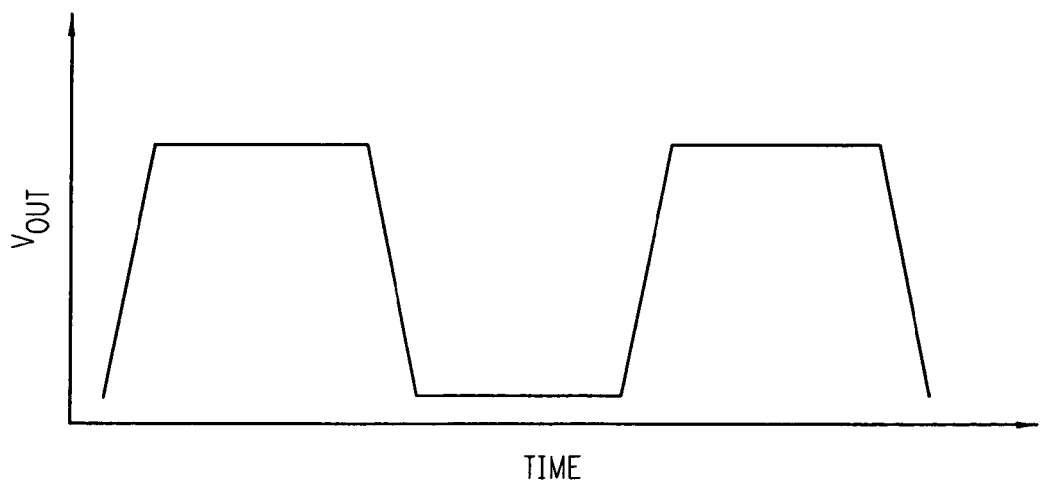

If the switching frequency is increased then losses associated with the switching portion of this envelope amplifier circuit will also increase. Ultimately, switching frequency is limited by the selection of the power MOSFETS. On the other hand if the switching frequency is decreased this will result in fewer transitions as shown in the difference between FIG. 4A and FIG. 4B. Fewer transitions yields better efficiency, but with additional switching stage distortions, which may be corrected by the use of a push pull stage (125 & 130 shown in FIG. 2). As a result a higher frequency is preferably chosen to lower switching stage distortions and slightly lower efficiency for the switching stage. Also, the drain of the MOSFET used in switching stage 140 is preferably voltage limited, e.g., with a diode coupled to ground, and low pass filtered with a Lf, Cf network. For example, the low pass filter network may be designed to pass signals 200 kHz and lower to the load (RF power module drain supply). This allows for 22-25 dB suppression of switching frequency spurious signals produced by the pulse section. Resulting examples of switching frequency effects are shown in FIG. 3. For this example, pulse stage efficiency enhancement can be explained by an 8 times decrease in the $P_{out}$, while switching losses have been reduced by 2.5. At the same time switching stage 140 losses remained unchanged because switching frequencies in this stage did not change.

Next, the video bandwidth requirements for the envelope amplifier will be described for a preferred implementation. Analyses of examples of typical input RF envelopes (see FIG. 5 discussed below) show that spectral components have bandwidth from 0 to 15 MHz. An envelope based predistorter 27 is preferably used to predistort the detected RF envelope. During this predistortion process higher order harmonics are generated. Therefore, a wide bandwidth envelope amplifier is desired for proper harmonic amplification. Input RF signal envelope predistortion is employed in order to maintain overall constant gain. Simulations and experiments show that fourth and higher order harmonics are not required. If the maximum envelope frequency is 15 MHz then the third order harmonic frequency is 45 MHz, which requires the envelope amplifier to have a flat video response from 0 to about 50 MHz. In addition to this wide frequency response, the envelope amplifier must be capable of supplying DC current.

Figure 5:
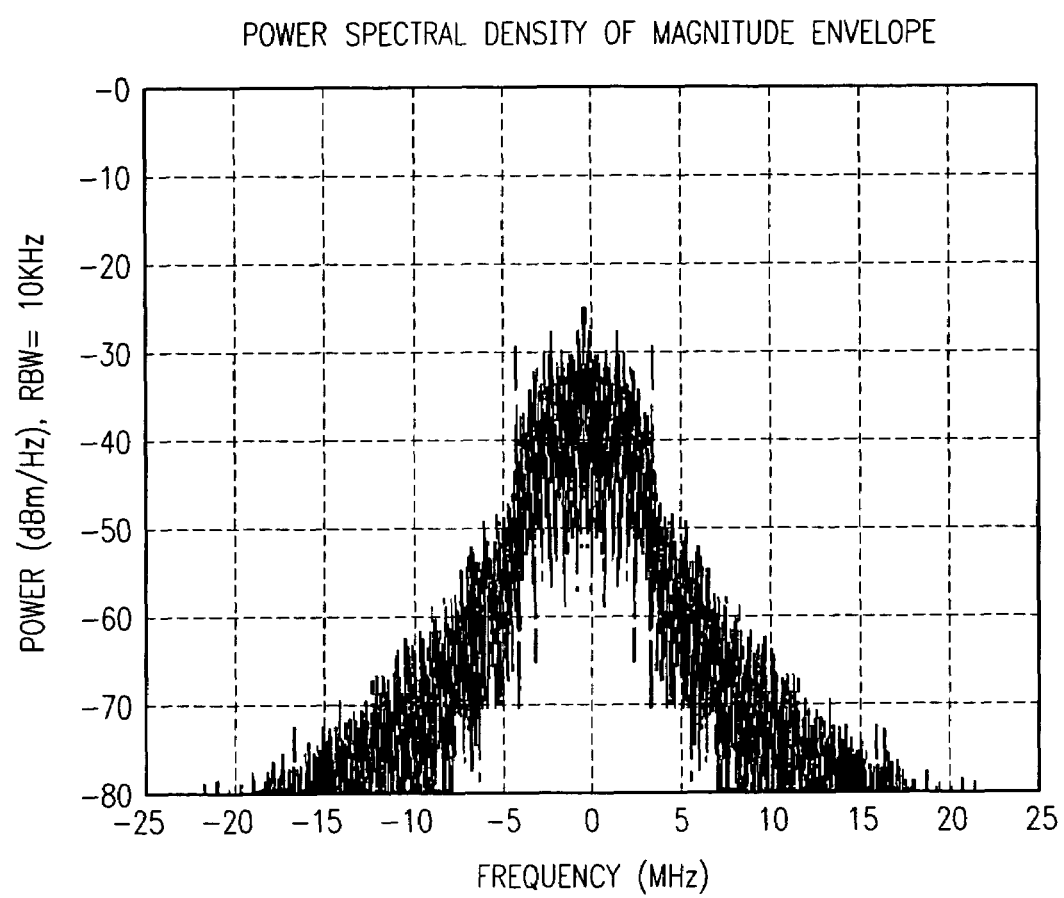
FIG. 5 is a spectral analysis of a representative single WCDMA signal envelope.
Figure 6:
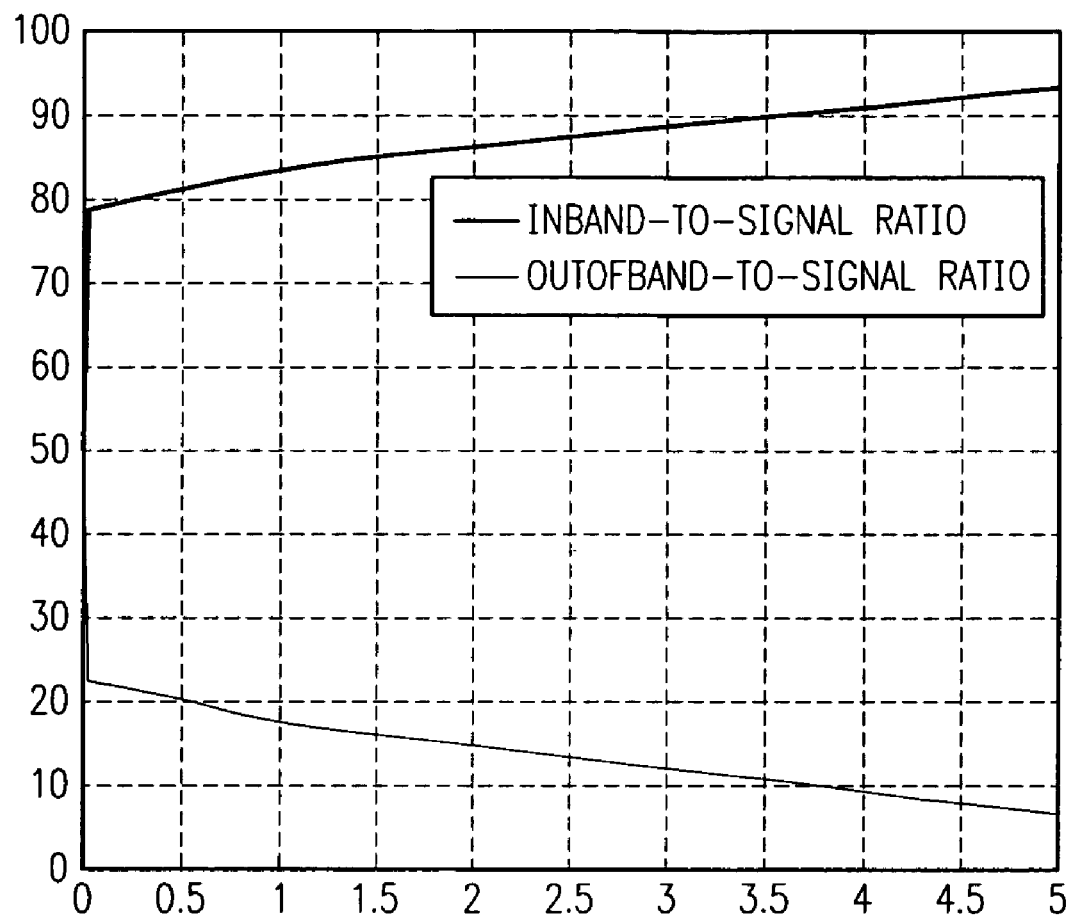
FIG. 6 is a graph showing power distribution vs. frequency analysis of the envelope signal of FIG. 5.

Referring to FIG. 5, spectral analyses of a representative single WCDMA signal envelope reveals that the majority of the signal energy is concentrated in a narrow bandwidth around the carrier center frequency. A multicarrier WCDMA signal envelope is very similar. As shown in FIG. 5 the envelope spectrum for a single-carrier WCDMA signal appreciably peaks at low frequencies. Power distribution vs. frequency analysis, as shown in FIG. 6, of the envelope signal reveals that approximately 80% of the total envelope power is contained in the lower 1 MHz bandwidth, around the carrier frequency. Furthermore, signal power in the 0 to 200 KHz bandwidth range is 6 dB higher than the power outside of this bandwidth.

Variation in Vds as provided by the variable supply along line 85 (FIG. 1) may result in a gain and phase variation in a transistor stage. This affect may be addressed by continuously and advantageously adjusting control voltage 16c of the variable attenuator 16 as a function of drain supply voltage 85 as provided by predistortion circuit 27. Similarly, dynamic phase variation vs. Vds is controlled via phase shifter 18. Variable phase shifter 18 is responsive to phase shifter control voltage 18c, which is controlled by predistorter 27. Additional details are provided in the above referenced application Ser. No. 60/560,889.

FIGS. 1 through 6, discussed above, and the various embodiments used to describe the principles of the present invention are by way of illustration only and should not be construed in any way to limit the scope of the invention. Those skilled in the art will understand that the principles of the present invention may be implemented in any suitably disposed RF power amplifier.

What is claimed is:

1. A power amplifier system, comprising:
an input for receiving an RF input signal including a modulated RF carrier having a dynamically varying envelope;
a first signal path coupled to the input and including an RF amplifier receiving and amplifying the RF input signal including said carrier and envelope, the RF amplifier having a power supply input;
a DC power supply; and
a second signal path coupled to the input and comprising an envelope detector and an envelope amplifier responsive to the output of the envelope detector and coupled to the DC power supply and RF amplifier, wherein said envelope amplifier provides a power supply signal to the RF amplifier which varies with the envelope of the input signal to control the back off of the RF amplifier;
wherein said envelope amplifier comprises a switching circuit which switches a power supply signal into said RF amplifier power supply input with a frequency related to the envelope of the input signal;
wherein said envelope amplifier further comprises a threshold detector; and
wherein said envelope amplifier further comprises a preamplifier and a push pull circuit, wherein said preamplifier is coupled to the envelope detector output, said push pull circuit is coupled to the preamplifier output, and said push pull circuit and said switching circuit are coupled to said DC power supply.

2. A power amplifier system as set out in claim 1, wherein said push pull circuit comprises first and second MOSFET transistors of opposite conductivity type.

3. A power amplifier system, comprising:
an input for receiving an RF input signal including a modulated RF carrier having a dynamically varying envelope;
a first signal path coupled to the input and including an RF amplifier receiving and amplifying the RF input signal including said carrier and envelope, the RF amplifier having a power supply input;
a DC power supply; and
a second signal oath coupled to the input and comprising an envelope detector and an envelope amplifier responsive to the output of the envelope detector and coupled to the DC power supply and RF amplifier, wherein said envelope amplifier provides a power supply signal to the RF amplifier which varies with the envelope of the input signal to control the back off of the RF amplifier;
wherein said envelope amplifier comprises a switching circuit which switches a power supply signal into said RF amplifier power supply input with a frequency related to the envelope of the input signal;
wherein said envelope amplifier further comprises a threshold detector; and
wherein said first signal path further comprises a voltage variable attenuator for adjusting the magnitude of the input signal and wherein said second signal path further comprises a predistorter coupled to the output of said envelope detector and providing a control signal to said voltage variable attenuator based on the envelope signal output from said envelope detector.

4. A power amplifier system, comprising:
an input for receiving an RF input signal including a modulated RF carrier having a dynamically varying envelope;
a first signal path coupled to the input and including an RF amplifier receiving and amplifying the RF input signal including said carrier and envelope, the RF amplifier having a power supply input;
a DC power supply; and
a second signal path coupled to the input and comprising an envelope detector and an envelope amplifier responsive to the output of the envelope detector and coupled to the DC power supply and RF amplifier, wherein said envelope amplifier provides a power supply signal to the RF amplifier which varies with the envelope of the input signal to control the back off of the RF amplifier;
wherein said envelope amplifier comprises a switching circuit which switches a power supply signal into said RF amplifier power supply input with a frequency related to the envelope of the input signal;
wherein said envelope amplifier further comprises a threshold detector; and
wherein said first signal path further comprises a phase adjuster for adjusting the phase of the input signal and wherein said second signal path further comprises a predistorter coupled to the output of said envelope detector and providing a control signal to said phase adjuster based on the envelope signal output from said envelope detector.

5. A power amplifier system, comprising:
an RF input for receiving an RF input signal;
an RF output for providing an amplified RF output signal in response to said RF input signal;
a coupler having its input port coupled to the RF input and having first and second outputs;
a first signal delay element coupled to the first output of said coupler;
a first voltage variable attenuator having an input coupled to the output of said first signal delay element and a control port;
a phase shifter having an input port coupled to the output port of said first voltage variable attenuator;
a first gain stage having an input port coupled to the output of said phase shifter;

a power gain module comprising at least one RF power amplifier and having an input port, an output port, and a DC supply port, wherein the input port is coupled to the output of said first gain stage and wherein the output port is coupled to said RF output;

an envelope detector functionally coupled to the second output of said coupler, wherein said envelope detector is operable to determine an envelope of the input RF signal;

a predistorter having an input port functionally coupled to the output of said envelope detector, said predistorter having first, second and third output control ports and wherein the control port of said voltage variable attenuator is coupled to the first output port of the predistorter and wherein the control port of said phase shifter is coupled to the second output port of the predistorter;

a switch mode envelope amplifier having an input port coupled to the third output port of said predistorter, a first output DC port coupled to the DC supply port of said power gain module, and first and second input DC ports;

a DC power supply providing a plurality of DC voltages and having at least one input DC port, wherein said DC power supply is coupled to said first and second input DC ports of said switch mode envelope amplifier;

a level setting network having a control output;

a second voltage variable attenuator having an input port functionally coupled to said coupler and a control port coupled to the control output of the level setting network; and a second gain stage having an input port coupled to the output of said second voltage variable attenuator and an output port coupled to said envelope detector.

6. A power amplifier system as set out in claim 5 wherein said coupler is a directional coupler.

7. A power amplifier system as set out in claim 5, wherein said power gain module comprises a drive stage and a power gain stage comprising said at least one RF power amplifier and wherein the drive stage and power gain stage have separate DC supply terminals.

8. A power amplifier system, comprising:
an RF input for receiving an RF input signal;
an RF output for providing an amplified RF output signal in response to said RF input signal;
a coupler having its input port coupled to the RF input and having first and second outputs;
a first signal delay element coupled to the first output of said coupler;
a first voltage variable attenuator having an input coupled to the output of said first signal delay element and a control port;
a phase shifter having an input port coupled to the output port of said first voltage variable attenuator;
a first gain stage having an input port coupled to the output of said phase shifter;
a power gain module comprising at least one RF power amplifier and having an input port, an output port, and a DC supply port, wherein the input port is coupled to the output of said first gain stage and wherein the output port is coupled to said RF output;
an envelope detector functionally coupled to the second output of said coupler, wherein said envelope detector is operable to determine an envelope of the input RF signal;
a predistorter having an input port functionally coupled to the output of said envelope detector, said predistorter having first, second and third output control ports and wherein the control port of said voltage variable attenuator is coupled to the first output port of the predistorter and wherein the control port of said phase shifter is coupled to the second output port of the predistorter;

a switch mode envelope amplifier having an input port coupled to the third output port of said predistorter, a first output DC port coupled to the DC supply port of said power gain module, and first and second input DC ports; and a DC power supply providing a plurality of DC voltages and having at least one input DC port, wherein said DC power supply is coupled to said first and second input DC ports of said switch mode envelope amplifier;

wherein said switch mode envelope amplifier comprises:
a preliminary amplifier;
a first DC supply terminal having positive and negative input terminals;
a second DC supply terminal having positive and negative input terminals;
a first MOSFET transistor having gate, source and drain terminals;
a current sensing resistor, disposed between said first DC positive terminal and the drain of said first MOSFET transistor and having a first and second terminal;
a second MOSFET transistor having gate, source and drain terminals, wherein said source terminal is functionally coupled to ground;
a comparator which responds to an amplitude of current through said current sensing resistor, said comparator having a first input coupled to said resistor first terminal and a second input coupled to said resistor second terminal; and
a switching stage having an input coupled to said comparator and an output functionally coupled to a drain supply positive terminal.

9. A power amplifier system as set out in claim 8, further comprising a feedback module having an input port and an output port coupled to said preamplifier, wherein a common junction node is formed between said first MOSFET source terminal, said second MOSFET drain terminal, said switching stage output port, said second DC supply positive terminal, and said feedback module input port.

10. A power amplifier system as set out in claim 9, wherein said preliminary amplifier further comprises:
a positive input port for receiving said envelope signal;
a negative input port for receiving said envelope signal;
a first gate drive port, functionally coupled to the gate terminal of said first MOSFET transistor;
a second drive port, functionally coupled to the gate terminal of said second MOSFET transistor; and
a feedback port coupled to the output port of said feedback module.

11. A power amplifier system as set out in claim 9, wherein the threshold limit is the current through said current sensing resistor.

12. A power amplifier system as set out in claim 8, wherein said second DC supply terminal is functionally coupled to said power gain stage DC supply terminal.

13. A power amplifier system as set out in claim 8, wherein the switching stage is operable at a frequency of between 1 and 50 MHz.

14. A power amplifier system as set out in claim 8, wherein the switching stage current contribution is determined by a current threshold limit.

* * * * *